(12) United States Patent
Manabe et al.

(10) Patent No.: US 6,711,019 B2
(45) Date of Patent: Mar. 23, 2004

(54) MOUNTING FITTING OF HEAT SINK AND METHOD OF REMOVING THE SAME

(75) Inventors: Seji Manabe, Fukuoka (JP); Kaoru Sato, Kumamoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/180,505

(22) Filed: Jun. 27, 2002

(65) Prior Publication Data

US 2003/0002258 A1 Jan. 2, 2003

(30) Foreign Application Priority Data

Jun. 29, 2001 (JP) ........................................ 2001-198173

(51) Int. Cl.$^7$ ................................................ H05K 7/20
(52) U.S. Cl. .......................... 361/704; 24/296; 24/456; 165/80.3; 165/185; 174/16.3; 257/718; 257/719; 361/710; 361/715; 411/523
(58) Field of Search .................. 24/295–296, 456–459, 24/625; 165/80.2, 80.3, 185, 121, 126; 174/16.3; 248/505, 510; 257/718–719, 726–727; 361/687, 694–697, 704, 707, 709, 710, 715; 411/522, 523; 439/485, 487

(56) References Cited

U.S. PATENT DOCUMENTS

| 6,256,846 | B1 | * | 7/2001 | Lee ........................... 361/704 |
| 6,301,112 | B1 | * | 10/2001 | Lee ........................... 361/704 |
| 6,343,105 | B1 | * | 1/2002 | Huang et al. ............... 361/704 |
| 6,381,813 | B1 | * | 5/2002 | Lai ............................ 24/456 |

* cited by examiner

*Primary Examiner*—Gregg D. Thompson
(74) *Attorney, Agent, or Firm*—Wenderoth, Lind & Ponack L.L.P.

(57) ABSTRACT

A mounting fitting of a heat sink of the present invention is unitarily formed of a first spring, a second spring, a central part disposed in the boundary between the first and second springs, a first arm connected to an end of the first spring on the opposite side from the fulcrum, a second arm connected to an end of the second spring on the opposite side from the fulcrum, a plate part formed in the second spring and near the second arm and having a small hole, and a stopper formed in a space between the second spring and arm. The fitting allows safe removal of the heat sink.

4 Claims, 12 Drawing Sheets

MOUNTING FITTING OF HEAT SINK AND METHOD OF REMOVING THE SAME

FIELD OF THE INVENTION

The present invention relates to a fitting for mounting a cooling apparatus for cooling a micro-processing unit (MPU) used for a personal computer or the like to the MPU, and a removing method of the fitting.

BACKGROUND OF THE INVENTION

A heating value of an electronic instrument has recently increased in response to high integration of electronic components such as a semiconductor or increase of frequency of an operating clock. A problem of how junction temperatures of respective electronic components are kept within an operating temperature range becomes serious for normally operating the electronic components.

Especially, the integration and frequency of the MPU are extremely increased, so that measures against heat radiation become important for stabilizing an operation and securing the operating life.

The heat of the MPU mounted to an MPU socket is radiated by a heat sink and a fan having a motor. The heat sink increases a large heat radiating area and exchanges the heat with a refrigerant such as air. The fan forcibly feeds the refrigerant such as the air to the heat sink. Generally, the heat sink is removably mounted to the MPU so that the MPU can be replaced with a new MPU when the MPU fails or needs to be replaced.

Examples of a mounting structure and a mounting method of a conventional heat sink to an MPU are described with reference to FIG. 7 through FIG. 10.

Figure 7:
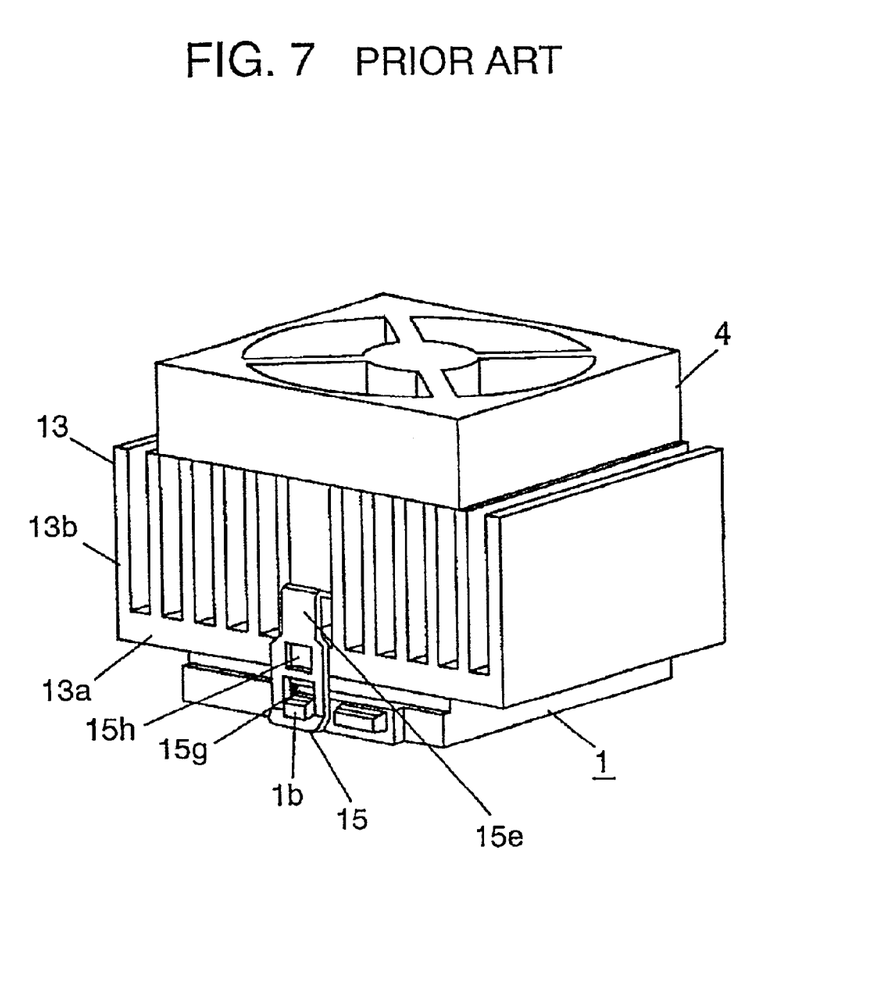
FIG. 7 is a perspective view of an entire MPU—heat sink—fan assembly using a mounting fitting of a conventional heat sink.
Figure 8:
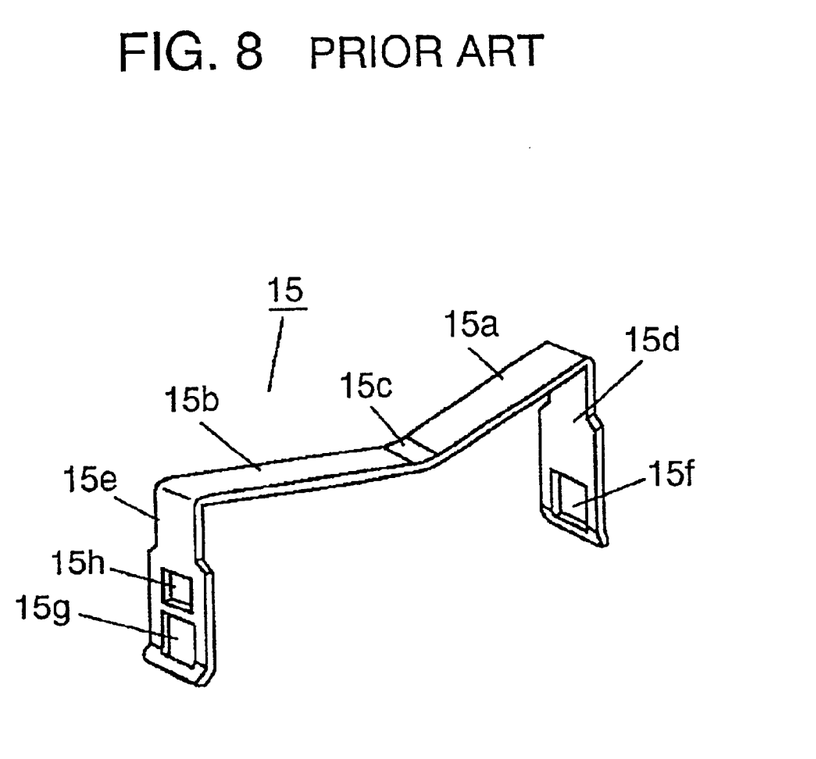
FIG. 8 is a perspective view of the mounting fitting of the conventional heat sink.
Figure 9A:
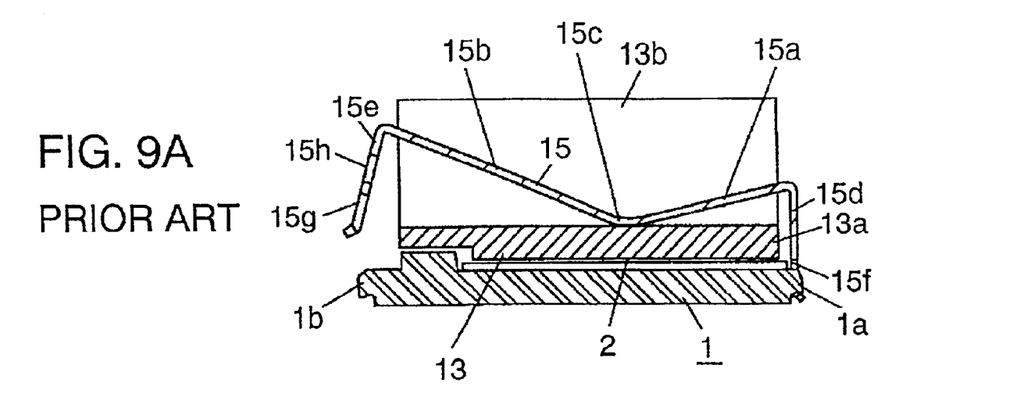
FIG. 9A, FIG. 9B, and FIG. 9C are sectional views of the conventional heat sink and fitting, which are used for illustrating a mounting method of the mounting fitting of the heat sink.
Figure 9B:
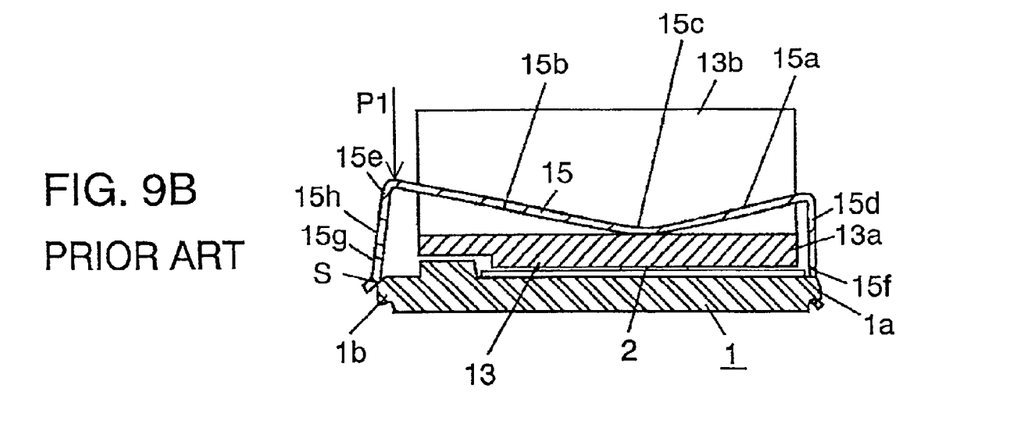
Figure 9C:
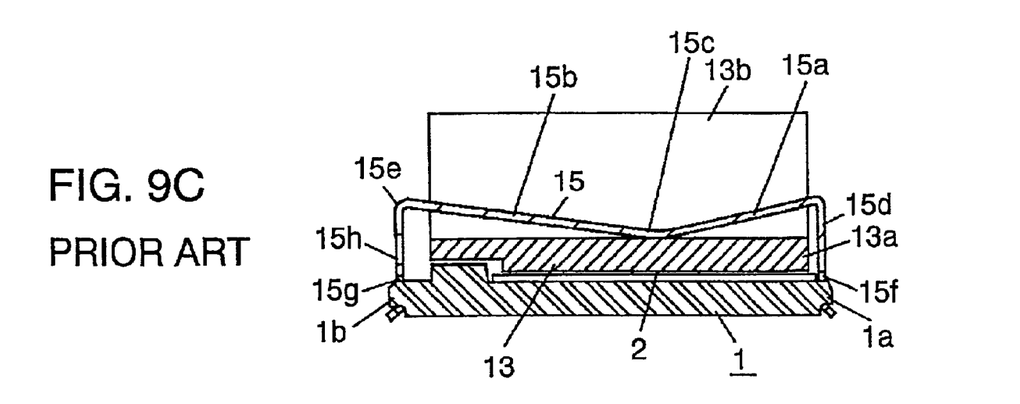
Figure 10A:
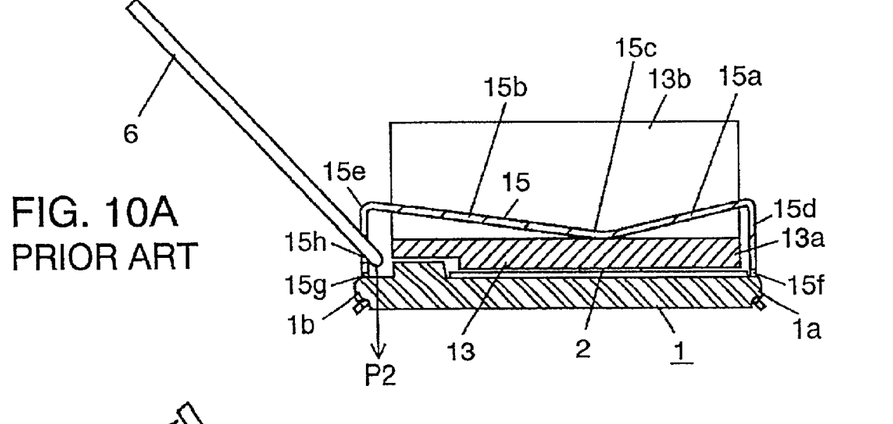
FIG. 10A, FIG. 10B, and FIG. 10C are sectional views of the conventional heat sink and fitting, which are used for illustrating a removing method of the mounting fitting of the heat sink.
Figure 10B:
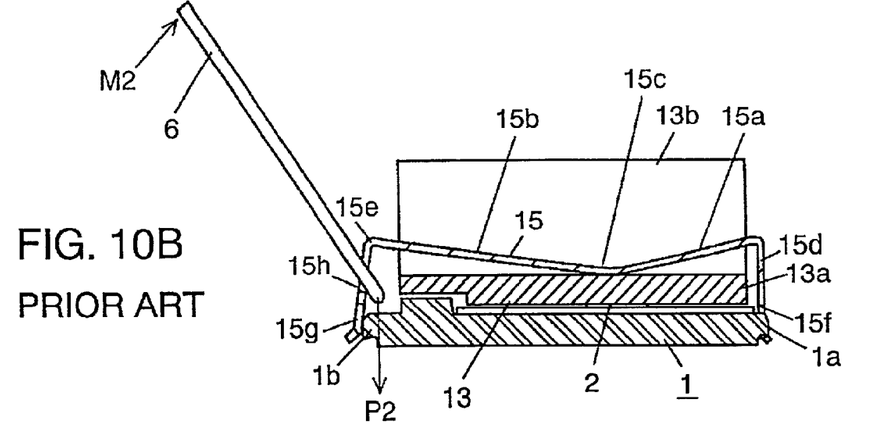
Figure 10C:
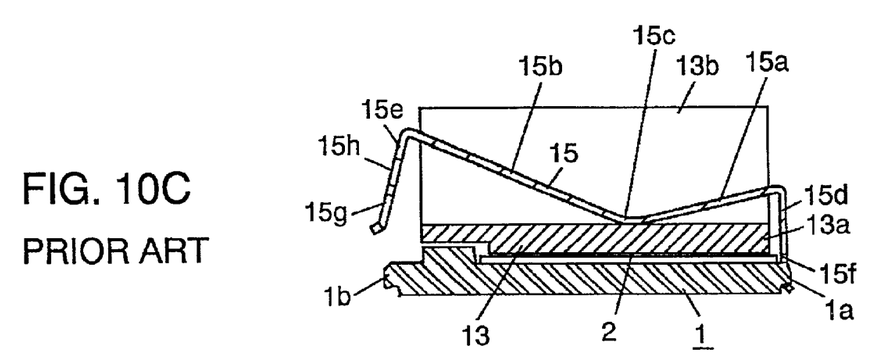

FIG. 7 is a perspective view of an entire MPU—heat sink—fan assembly using a mounting fitting of the conventional heat sink, and FIG. 8 is a perspective view of the mounting fitting of the conventional heat sink. FIG. 9A, FIG. 9B, and FIG. 9C are sectional views of the heat sink and the fitting, and are used for illustrating a mounting method of the mounting fitting of the conventional heat sink. FIG. 10A, FIG. 10B, and FIG. 10C are sectional views of the heat sink and the fitting, and are used for illustrating a removing method of the mounting fitting of the conventional heat sink.

In FIG. 7 and FIG. 9A, MPU socket 1 is entirely formed in a plate shape having a predetermined thickness, and has first locking claw 1a and second locking claw 1b on its one side and the other side, respectively. MPU 2 of a pin grid array (PGA) type package generating heat is mounted on MPU socket 1, and heat sink 13 touches on the upper surface of MPU 2 and radiates heat from MPU 2.

Heat sink 13 has base part 13a in its lower part and fin part 13b disposed on base part 13a. Fin part 13b receives the heat conducted from base part 13a and radiates the heat to ambient air.

Fan 4 is disposed on heat sink 13 and forcibly air-cools the heat sink 13. Mounting fitting 15 is disposed on heat sink 13 and fixes heat sink 13.

Mounting fitting 15 is entirely formed in an M shape. Mounting fitting 15 comprises the following elements:

(a) first spring 15a and second spring 15b disposed in the intermediate positions;
(b) fulcrum 15c that is disposed in the boundary between first spring 15a and second spring 15b and presses heat sink 13;
(c) first arm 15d connecting to an end of first spring 15a on the opposite side to fulcrum 15c;
(d) second arm 15e connecting to an end of second spring 15b on the opposite side to fulcrum 15c;
(e) plate part 15f disposed on first arm 15d and having a first locking hole engaging with first locking claw 1a;
(f) plate part 15g disposed on second arm 15e and having a second locking hole engaging with second locking claw 1b;
(g) plate part 15h having a square hole and formed near the directly above part of plate part 15g having the second locking hole. Bar 6 is a precision screwdriver for removal, and is thin and highly rigid.

A cooling operation of a cooling apparatus comprising the components discussed above is briefly described. The heat generated from MPU 2 is received by the bottom surface of base part 13a, and diffuses inside base part 13a. The heat then conducts to fin part 13b functioning as a heat radiating fin, is forcibly air-cooled by fan 4, and is radiated to the ambient air.

Referring to FIG. 9A, FIG. 9B, and FIG. 9C, there is described a method of crimping and fixing heat sink 13 onto MPU 2.

Firstly, heat sink 13 is placed on MPU 2 mounted to MPU socket 1, mounting fitting 15 is placed on heat sink 13, and plate part 15f having the first locking hole is hooked on first locking claw 1a of socket 1 (FIG. 9A).

Then, while fulcrum 15c of mounting fitting 15 is in contact with the upper face of base part 13a of heat sink 13, a load (P1 shown in FIG. 9B) is applied to second spring 15b to press it down until the tip of second arm 15e contacts with the upper part of second locking claw 1b of socket 1 (FIG. 9B). When second spring 15b is further pressed down, the lower part of second arm 15e touches on the slope (S shown in FIG. 9B) of the upper part of second locking claw 1b to open second arm 15e. Therefore, plate part 15g having the second locking hole is finally hooked on second locking claw 1b (FIG. 9C). Fan 4 may be mounted on heat sink 13 after that, or may be previously mounted on heat sink 13.

Referring to FIG. 10A, FIG. 10B, and FIG. 10C, there is described a method of removing heat sink 13. Firstly, bar 6 is inserted into the square hole in plate part 15h of mounting fitting 15, and a load (P2 shown in FIG. 10A) is applied to bar 6 to press bar 6 down until the lower end of plate part 15g having the second locking hole moves below the lower end of second locking claw 1b of socket 1 (FIG. 10A).

Then, a load (M2 shown in FIG. 10B) is applied to bar 6 with load P2 applied, thereby bending second arm 15e of mounting fitting 15 outwardly (FIG. 10B). When load P2 for pressing down second arm 15e is then removed, plate part 15g having the second locking hole comes off second locking claw 1b due to restoring forces of first spring 15a and second spring 15b of mounting fitting 15 (FIG. 10C). When plate part 15f having the first locking hole hooked on first locking claw 1a is removed, the entire mounting fitting 15 is removed to allow heat sink 13 to be removed.

Figure 11:
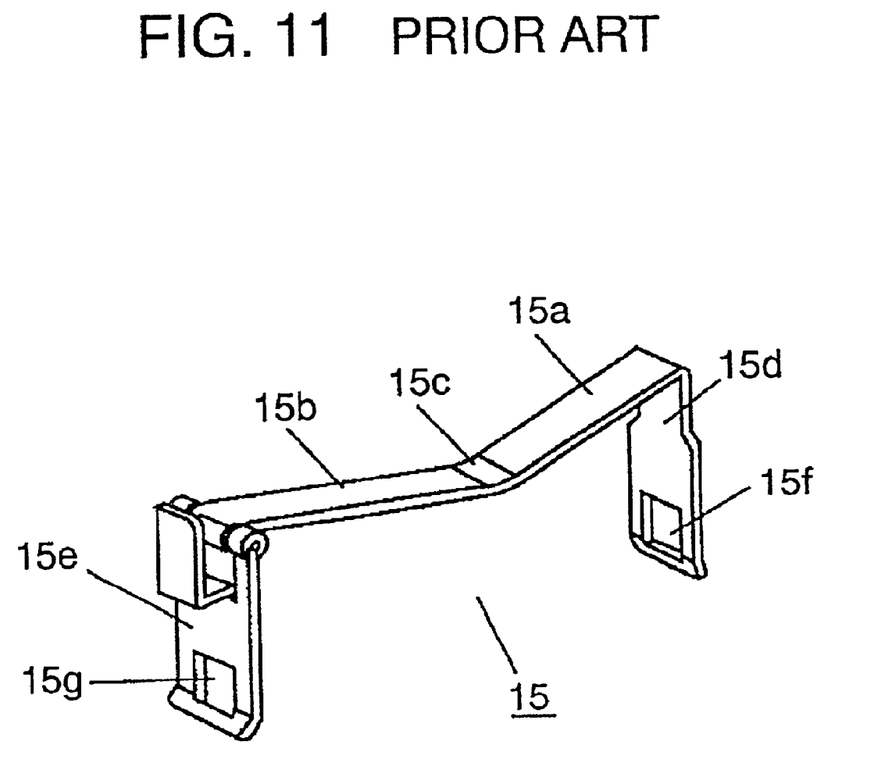
FIG. 11 is a perspective view of a mounting fitting of another conventional heat sink.
Figure 12:
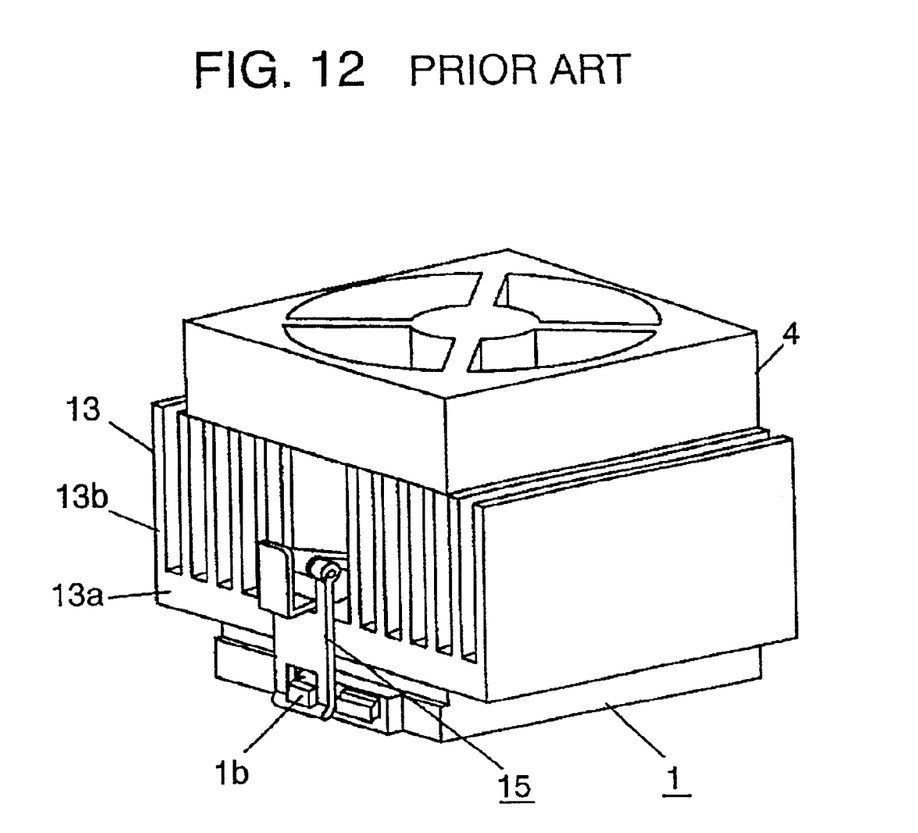
FIG. 12 is a perspective view of an entire MPU—heat sink—fan assembly using the mounting fitting of the conventional heat sink of FIG. 11.

In another embodiment, mounting fitting 15 may be a link mechanism assembly comprising a plurality of components as shown by a perspective view of a mounting fitting of another conventional heat sink of FIG. 11. FIG. 12 is a perspective view of an entire MPU—heat sink—fan assembly using the mounting fitting of the heat sink of FIG. 11.

SUMMARY OF THE INVENTION

A substantially M-shaped mounting fitting made of a plate-like elastic material crimps and fixes a heat sink onto a heating element. The heating element is mounted on a socket, and the heat sink diffuses heat from the heating element. The mounting fitting of the heat sink comprises the following elements: a first spring; a second spring coupled to the first spring; a central part that is a boundary part between the first spring and the second spring and functions as a fulcrum for pressing the heat sink; a first arm connected to an end of the first spring on the opposite side from the fulcrum; a second arm connected to an end of the second spring on the opposite side from the fulcrum; a plate part having a small hole and formed in the second spring and near the second arm; and a stopper formed in a space sandwiched between the second spring and the second arm.

DESCRIPTION OF THE PREFERRED EMBODIMENTS

Exemplary embodiments of the present invention will be described hereinafter with reference to the accompanying drawings.

EXEMPLARY EMBODIMENT 1

Figure 1:
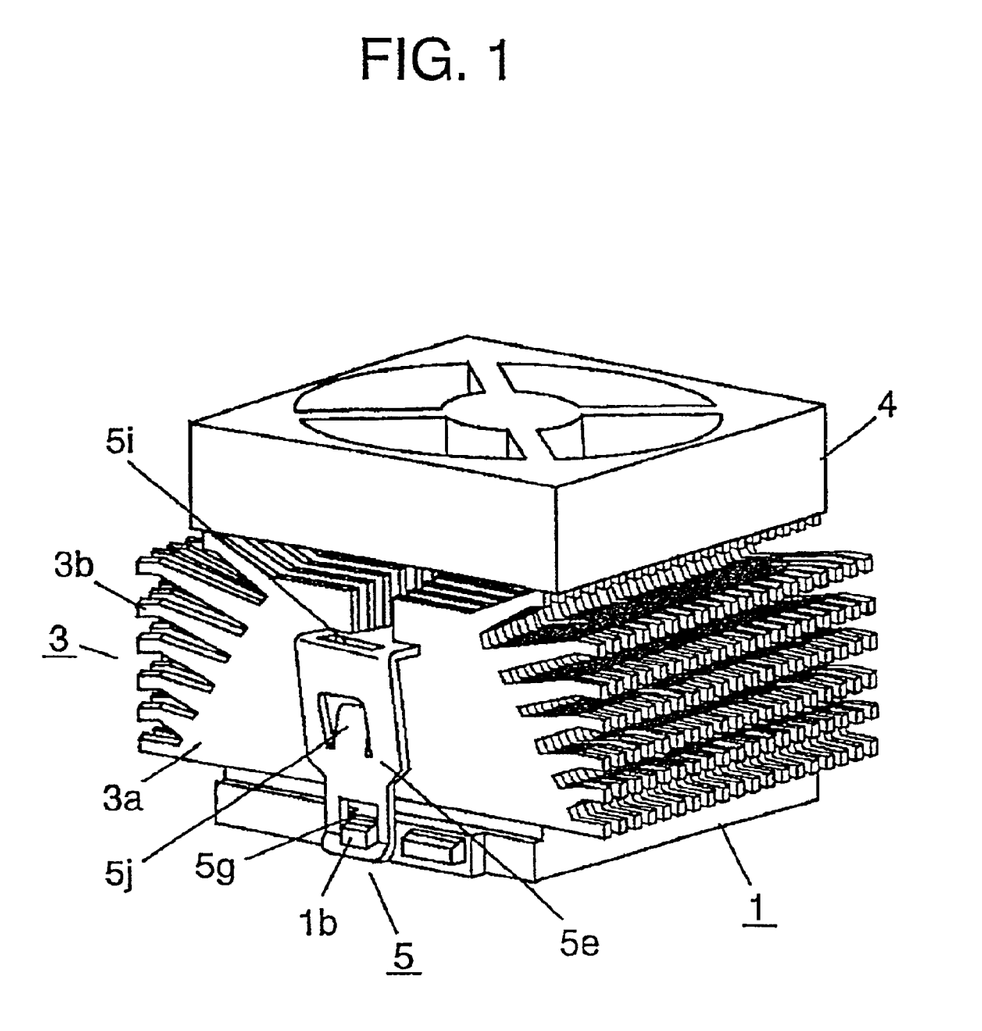
FIG. 1 is a perspective view of an entire MPU—heat sink—fan assembly using a mounting fitting of a heat sink in accordance with exemplary embodiment 1 of the present invention.
Figure 2:
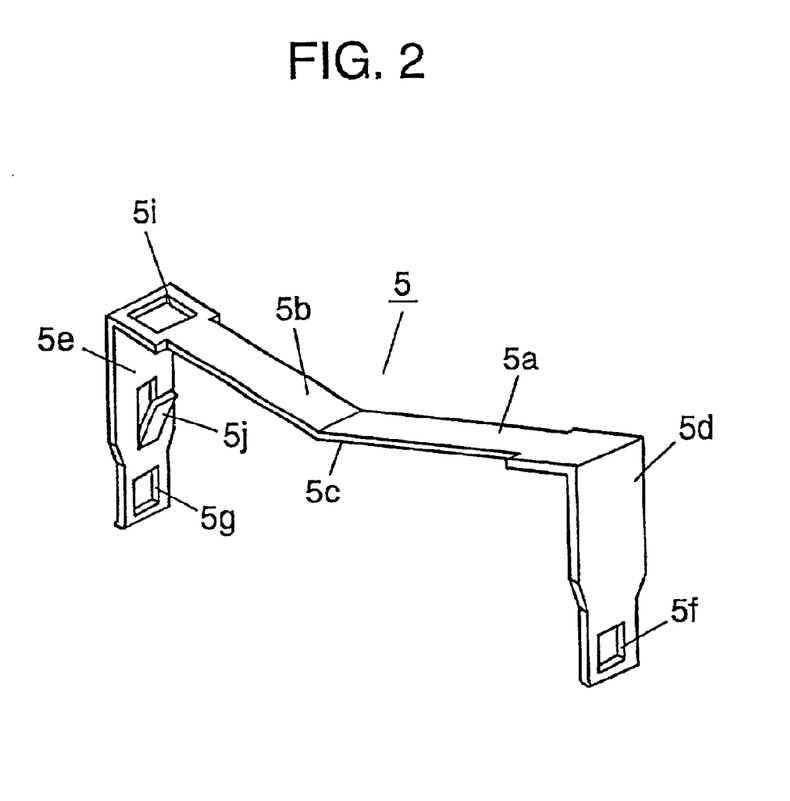
FIG. 2 is a perspective view of the mounting fitting of the heat sink in accordance with exemplary embodiment 1.

FIG. 1 is a perspective view of an entire MPU—heat sink—fan assembly using a mounting fitting of a heat sink in accordance with exemplary embodiment 1 of the present invention. FIG. 2 is a perspective view of the mounting fitting of the heat sink in accordance with exemplary embodiment 1. In these drawings, the same elements used in the prior art are denoted with the same reference number.

In FIG. 1, FIG. 2, FIG. 3A, FIG. 3B, and FIG. 3C, MPU socket 1 has a predetermined thickness, is formed in a plate shape, and has first locking claw 1a at its one side and second locking claw 1b at the other side. MPU socket 1 is sold as a standard product by many connector. manufacturers MPU 2 of a PGA type package generating heat is mounted on the upper surface of MPU socket 1. Heat sink 3 touches on MPU 2, receives heat from MPU 2, and radiates the heat. Heat sink 3 has base part 3a and fin part 3b that receives the heat from base part 3a and radiates the heat to the ambient air.

Fan 4 forcibly air-cools heat sink 3. One fan 4 is used in the present embodiment; however, fan 4 is not necessarily required in an environment in which convection of the ambient air can be expected to cool fin part 3b. A plurality of fans may be used as necessary. When fan 4 is used, preferably, fan 4 is previously engaged with heat sink 3 in a predetermined positional relation in a method such as screwing, adhering, or snap fitting. A subsequent assembling process can thus be performed smoothly.

Mounting fitting 5 is installed on heat sink 3 to press and fix heat sink 3 to MPU 2. Mounting fitting 5 is entirely formed as an M-shaped plate as shown in FIG. 2, and manufactured by bending a plate material. An elastic material such as stainless steel for a spring or beryllium copper is preferably used as a material of mounting fitting 5 because the elastic material has a high elastic limit and withstands a large load.

Mounting fitting 5 comprises the following elements:
(a) first spring 5a and second spring 5b in the central part;
(b) fulcrum 5c that is a boundary part between first spring 5a and second spring 5b and presses heat sink 3;
(c) first arm 5d connected to an end of first spring 5a on the opposite side from fulcrum 5c;
(d) second arm 5e connected to an end of second spring 5b on the opposite side from fulcrum 5c;
(e) plate part 5f disposed in first arm 5d and having a first locking hole for engaging with first locking claw 1a;
(f) plate part 5g disposed in second arm 5e and having a second locking hole for engaging with second locking claw 1b.

Plate part 5i having a small hole is disposed in a part of second spring 5b near second arm 5e, and a tongue-like stopper 5j is raised inwardly in second arm 5e.

A region from the part of second spring 5b including plate part 5i to second arm 5e has a width larger than that of other part of second spring 5b. This region is bent, receives a force as described later when mounting fitting 5 is removed from MPU socket 1, and has a small essential width because of existence of plate part 5i having the small hole and stopper 5j. However, the width of the region is increased, thereby compensating strength of the region to prevent the deformation. Mounting fitting 5 may have the same width entirely based on a relation between a force of mounting fitting 5 for pressing heat sink 3 on MPU 2 and the strength of mounting fitting 5, and mounting fitting 5 may have a wider part and a narrower part depending on the holes and bending.

The end of first arm 5*d* on the side of plate part 5*f* having the first locking hole and the end of second arm 5*e* on the side of plate part 5*g* having the second locking hole are bent toward the outside of mounting fitting 5. This structure allows smooth mounting of mounting fitting 5 to MPU socket 1 as described later.

In mounting fitting 5, first spring 5*a* and second spring 5*b* mainly elastically deform, and a balance between a moment of a force by first spring 5*a* and a moment of a force by second spring 5*b* about fulcrum 5*c* is struck. The length of first spring 5*a* does not need to be equal to that of second spring 5*b*, but the lengths of the springs are preferably designed so that fulcrum 5*c* is disposed directly above MPU 2. That is because shifting of fulcrum 5*c* from the direct above position of MPU 2 can cause inclined mounting of heat sink 3.

Figure 4A:
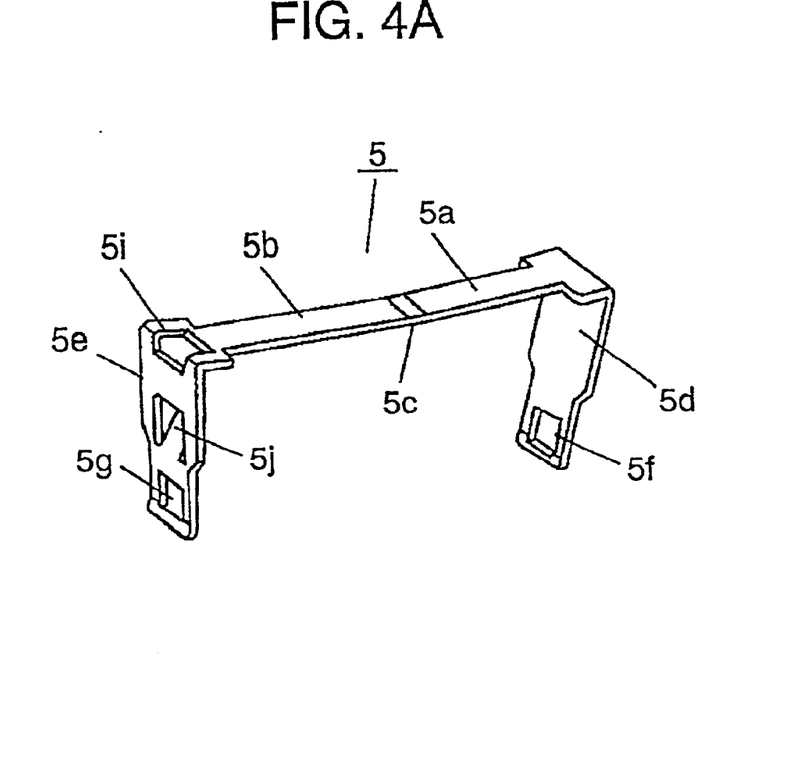
FIG. 4A and FIG. 4B are perspective views of the other configuration of the mounting fitting of the heat sink in accordance with exemplary embodiment 1.
Figure 4B:
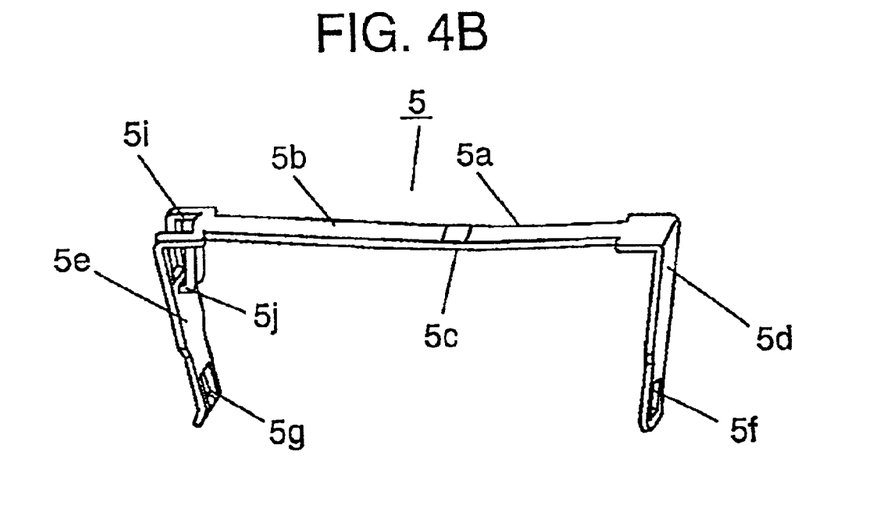

The configuration of mounting fitting 5 is not limited to the configuration shown in FIG. 2. FIG. 4A and FIG. 4B are perspective views of the other configurations of the mounting fitting of heat sink 3 in accordance with exemplary embodiment 1 of the present invention. Fulcrum 5*c* need not have a line shape, and may have a plane shape, or a point shape formed by partially machining the plate material into a spherical shape, as shown in FIG. 4A. Plate part 5*i* having the small hole may extend into second arm 5*e* as shown in FIG. 4A. In such a configuration, when the boundary between second spring 5*b* and second arm 5*e* is bent in manufacturing mounting fitting 5*j* by press working, the outline of plate part 5*i* can be prevented from deforming. Stopper 5*j* may be formed in not only second arm 5*e* but also second spring 5*b* as shown in FIG. 4B.

A cooling operation of a cooling apparatus of the present embodiment and a method of crimping and fixing heat sink 3 onto MPU 2 with the mounting fitting are not described because they are similar to those of the prior art.

Figure 3A:
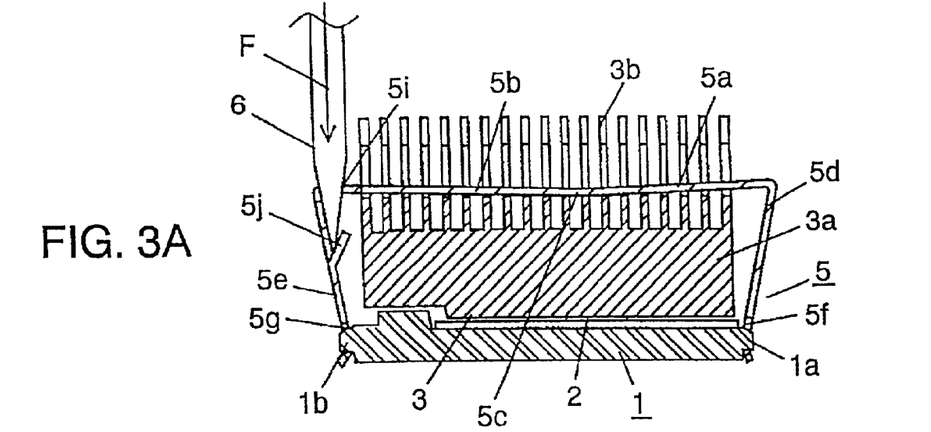
FIG. 3A, FIG. 3B, and FIG. 3C are sectional views of the heat sink and the fitting in accordance with exemplary embodiment 1, which are used for illustrating a removing method of the mounting fitting of the heat sink.
Figure 3B:
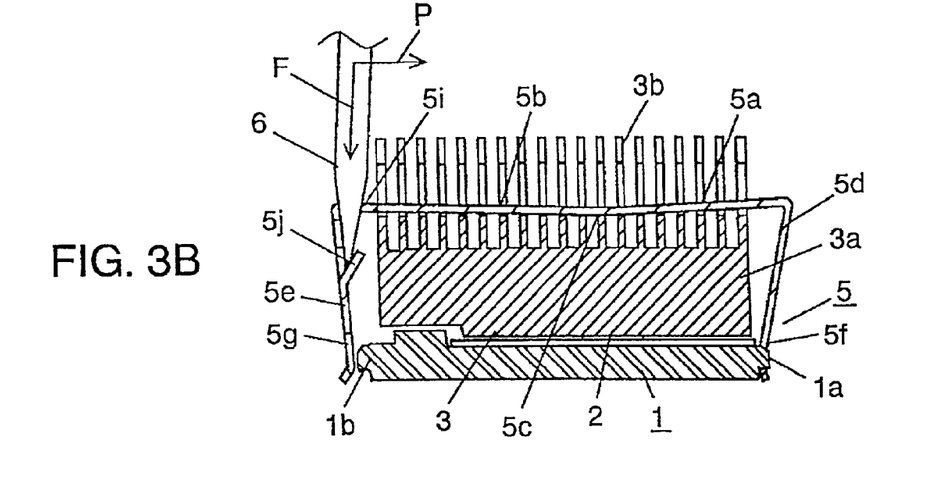
Figure 3C:
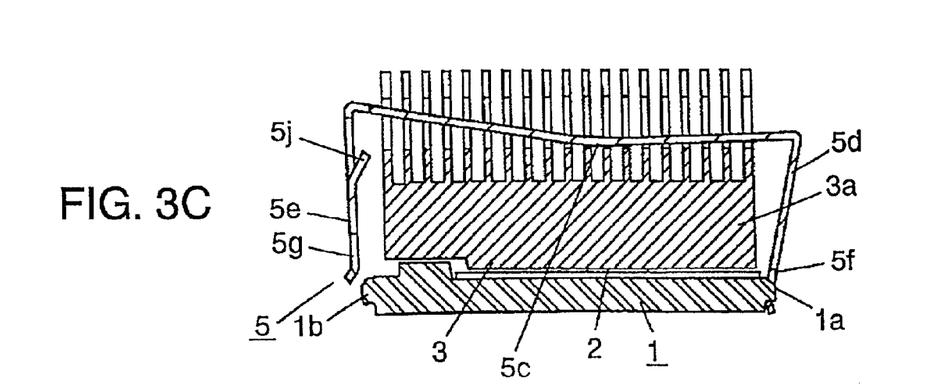

Referring to FIG. 3A, FIG. 3B, and FIG. 3C, there is described a method of removing heat sink 3. FIG. 3A, FIG. 3B, and FIG. 3C are sectional views of the heat sink and the fitting in accordance with exemplary embodiment 1 of the present invention, which are used for illustrating a removing method of the mounting fitting of the heat sink.

Bar 6 in the drawings is a tool used for removal, for example a flat tip screwdriver for common home use, and has a tapered tip and high rigidity.

Firstly, bar 6 is inserted into the small hole in plate part 5*i* of mounting fitting 5, and the tip of bar 6 is butted on stopper 5*j*. A hand having bar 6 applies a load (F shown in FIG. 3A) to second spring 5*b* of mounting fitting 5 to press down second spring 5*b* until the lower end of plate part 5*g* having the second locking hole of mounting fitting 5 comes below the lower end of second locking claw 1*b* of socket 1 (FIG. 3A).

Then, when the hand applies a load to bar 6 in the P direction of FIG. 3B with load F applied, a force works for bending second arm 5*e* outwardly about plate part 5*i* (FIG. 3B).

When load F for pressing down second spring 5*b* is then removed, plate part 5*g* having the second locking hole comes off second locking claw 1*b* of socket 1 due to restoring forces of first spring 5*a* and second spring 5*b* (FIG. 3C). When plate part 5*f* having the first locking hole hooked on first locking claw 1*a* is removed, entire mounting fitting 5 is removed to allow heat sink 3 to be removed.

Bar 6 is inserted into the small hole in plate part 5*i*, the tip of bar 6 is strongly butted on stopper 5*j*, and the removing work can thus be performed stably, so that bar 6 does not come off and an electric component is not damaged during the removing work.

In the above descriptions, plate part 5*f* disposed in first arm 5*d* and having a first locking hole is engaged with first locking claw 1*a* of the socket. Plate part 5*g* disposed in second arm 5*e* and having a second locking hole is engaged with second locking claw 1*b* of the socket.

However, plate part 5*f* disposed in first arm 5*d* may have a first locking claw and may be engaged with first locking hole 1*a* of the socket. Plate part 5*g* disposed in second arm 5*e* may have a second locking claw and may be engaged with second locking hole 1*b* of the socket.

EXEMPLARY EMBODIMENT 2

Figure 5A:
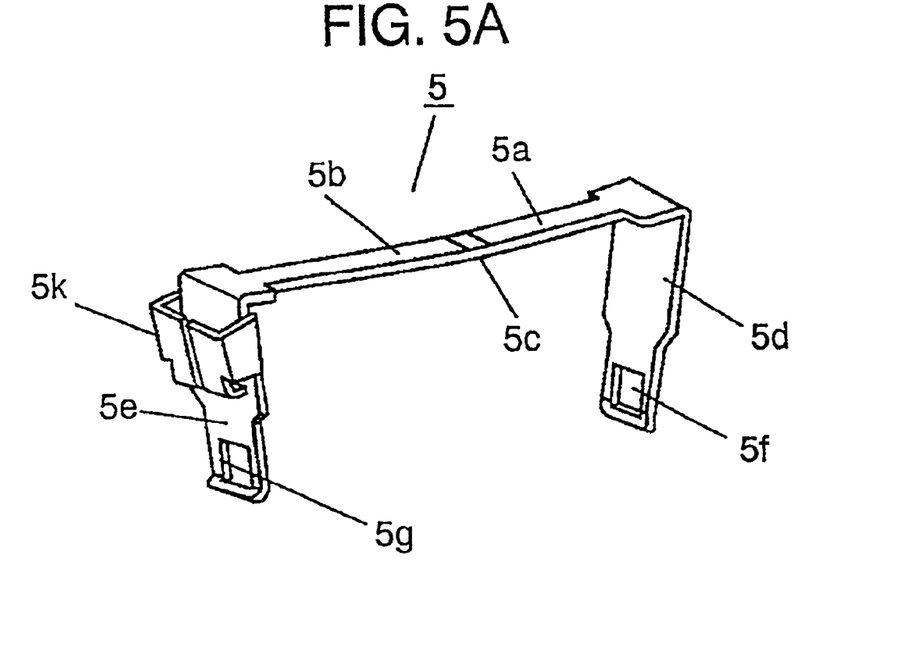
FIG. 5A is a perspective view of a mounting fitting of a heat sink in accordance with exemplary embodiment 2 of the present invention.
Figure 5B:
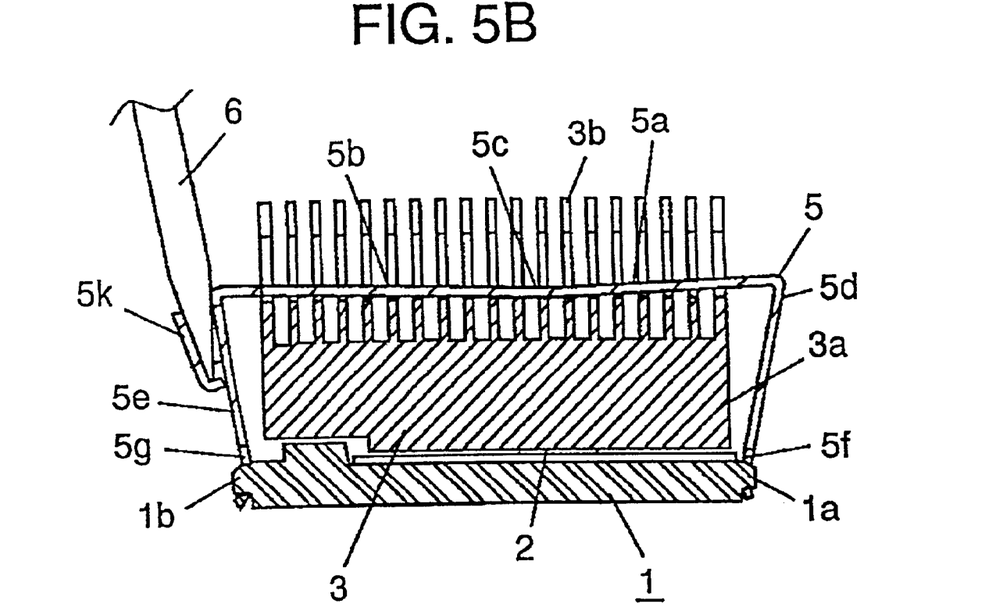
FIG. 5B is a sectional view of the heat sink and the fitting in accordance with exemplary embodiment 2, which is used for illustrating a removing method of the mounting fitting of the heat sink.

FIG. 5A is a perspective view of a mounting fitting of a heat sink in accordance with exemplary embodiment 2 of the present invention. FIG. 5B is a sectional view of the heat sink and the fitting in accordance with exemplary embodiment 2, which is used for illustrating a removing method of the mounting fitting of the heat sink. Numbers in the drawings are the same as those used in embodiment 1, and are not described.

Mounting fitting 5 includes plate part 5*i* having the small hole and stopper 5*j* in embodiment 1; however, instead of plate part 5*i* and stopper 5*j*, plate part 5*k* having a substantially-pocket-shaped opening is formed outside second arm 5*e* in embodiment 2.

For removing heat sink 3, bar 6 is inserted into plate part 5*k* having the substantially pocket shaped opening as shown in FIG. 5B. The other removing processes are the same as those in embodiment 1.

Bar 6 can interfere with fan 4 depending on the position or the size of fan 4 during the removing work in embodiment 1; however, in embodiment 2, the removing work can advantageously be performed with bar 6 further separated from fan 4, so that bar 6 hardly interferes with fan 4.

EXEMPLARY EMBODIMENT 3

Figure 6A:
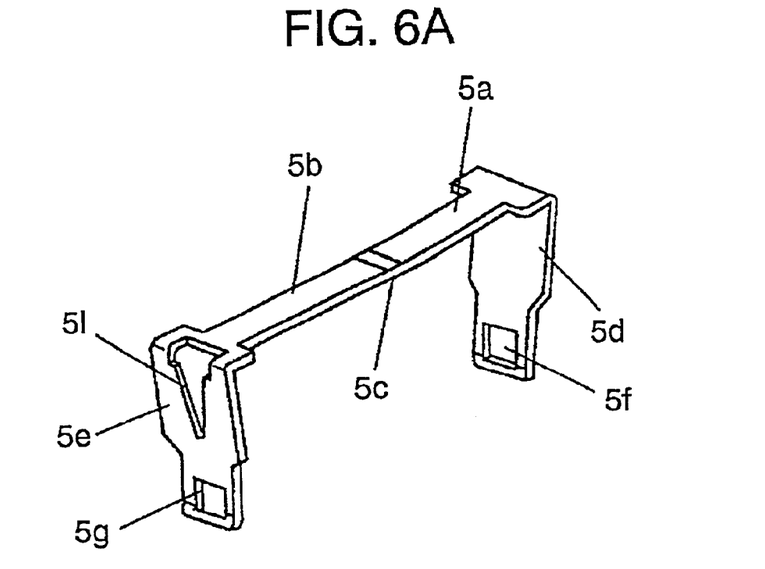
FIG. 6A is a perspective view of a mounting fitting of a heat sink in accordance with exemplary embodiment 3 of the present invention.
Figure 6B:
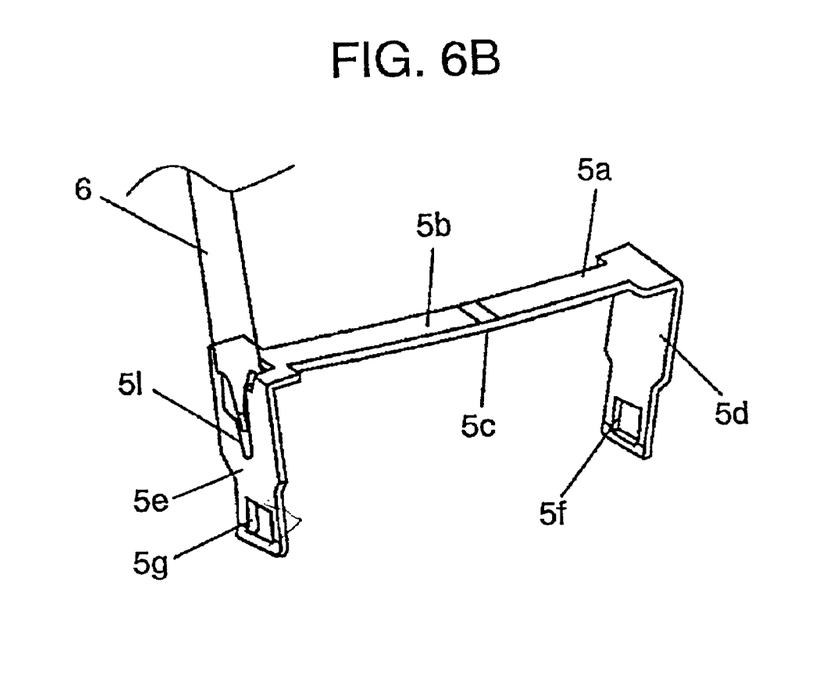
FIG. 6B shows engagement between the mounting fitting in accordance with exemplary embodiment 3 and a removing tool.

FIG. 6A is a perspective view of a mounting fitting of a heat sink in accordance with exemplary embodiment 3 of the present invention. FIG. 6B shows engagement between the mounting fitting in accordance with exemplary embodiment 3 and a removing tool. Numbers in the drawings are the same as those used in embodiment 1, and are not described.

Mounting fitting 5 includes plate part 5*i* having the small hole and stopper 5*j* in embodiment 1; however, instead of plate part 5*i* and stopper 5*j*, plate part 5*l* having a groove extending from second arm 5*e* to second spring 5*b* as shown in FIG. 6A is formed in embodiment 3. Plate part 5*l* having the groove on the second arm 5*e* side has a width decreasing with approach to plate part 5*g* having the second locking hole (substantial triangle). A cross tip screwdriver is used as bar 6 in embodiment 3.

For removing heat sink 3, as shown in FIG. 6B, plate part 5*l* having the groove is engaged with the tip of bar 6. Subsequent removing processes are the same as those in embodiment 1.

Bar 6 can interfere with fan 4 depending on the position or the size of fan 4 during the removing work in embodiment 1; however, in embodiment 3, the removing work can advantageously be performed with bar 6 further separated from fan 4, so that bar 6 hardly interferes with fan 4. Additionally, the configuration of mounting fitting 5 is not complicated differently from embodiment 2, so that the mounting fitting can be easily manufactured.

In the mounting fitting in accordance with embodiment 1 of the present invention, plate part 5*i* having the small hole functioning as a furculum of bar 6 used for the removing work is disposed in second spring 5*b* and near second arm 5*e*, and stopper 5*j* is disposed in a space sandwiched between second spring 5*b* and second arm 5*e*. Therefore, in removing heat sink 3, bar 6 can be inserted from the direct above part of heat sink 3, and the removing work is allowed even in a small space. Safe and certain removing work is allowed in a stable state of bar 6.

Plate part 5*k* having the substantially pocket shaped opening is formed outside second arm 5*e* in embodiment 2, so that bar 6 can be inserted from the direct above part of heat sink 3 in removing heat sink 3 to allow certain removing work.

Plate part 5*l* having a groove extending from second arm 5*e* to second spring 5*b* is formed in embodiment 3, so that bar 6 can be inserted from the direct above part of heat sink 3 in removing heat sink 3 to allow certain removing work.

What is claimed is:

1. A substantially M-shaped mounting fitting made of a plate-like elastic material, said mounting fitting for crimping and fixing a heat sink onto a heating element, the heat sink for diffusing heat of the heating element mounted on a socket, said mounting fitting of the heat sink comprising:

a first spring;

a second spring coupled to said first spring;

a central part being a boundary part between said first spring and said second spring and functioning as a fulcrum for pressing the heat sink;

a first arm coupled to an end of said first spring on the opposite side from said fulcrum;

a second arm coupled to an end of said second spring on the opposite side from said fulcrum;

a plate part formed in said second spring and near said second arm, and having a small hole; and a stopper formed in at least one of said second spring and said second arm.

2. A mounting fitting of a heat sink according to claim 1, wherein said stopper is formed in said second arm.

3. A mounting fitting of a heat sink according to claim 1, wherein said stopper is formed in said second spring.

4. A removing method of a substantially M-shaped mounting fitting made of a plate-like elastic material, the mounting fitting for crimping and fixing a heat sink onto a heating element, the heat sink for diffusing heat of the heating element mounted on a socket, the mounting fitting of the heat sink comprising:

a first spring;

a second spring coupled to the first spring;

a central part being a boundary part between the first spring and the second spring and functioning as a fulcrum for pressing the heat sink;

a first arm coupled to an end of the first spring on the opposite side from the fulcrum;

a second arm coupled to an end of the second spring on the opposite side from the fulcrum;

a plate part formed in the second spring and near the second arm, and having a small hole; and a stopper formed in at least one of the second spring and the second arm, said removing method comprising:

inserting a bar-like tool into the small hole of the plate part, the tool having a cross section shape allowing insertion into the small hole of the plate part; and bending the second arm outwardly with a tip of the tool while pressing the stopper down with the tool.

* * * * *